(12) United States Patent
Sadaka et al.

(10) Patent No.: US 7,419,866 B2
(45) Date of Patent: Sep. 2, 2008

(54) PROCESS OF FORMING AN ELECTRONIC DEVICE INCLUDING A SEMICONDUCTOR ISLAND OVER AN INSULATING LAYER

(75) Inventors: Mariam G. Sadaka, Austin, TX (US); Bich-Yen Nguyen, Austin, TX (US); Voon-Yew Thean, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 118 days.

(21) Appl. No.: 11/375,893

(22) Filed: Mar. 15, 2006

(65) Prior Publication Data

US 2007/0218707 A1   Sep. 20, 2007

(51) Int. Cl.
*H01L 21/8238* (2006.01)
(52) U.S. Cl. .............. 438/221; 438/584; 438/589; 438/153; 257/E21.546
(58) Field of Classification Search ......... 438/584, 438/221, 153, 589; 257/E21.546
See application file for complete search history.

(56) References Cited

U.S. PATENT DOCUMENTS

| | | | |
|---|---|---|---|
| 5,384,473 | A | 1/1995 | Yoshikawa et al. |
| 6,720,619 | B1 | 4/2004 | Chen et al. |
| 6,867,433 | B2 | 3/2005 | Yeo et al. |
| 6,909,147 | B2 | 6/2005 | Aller et al. |
| 6,911,383 | B2 | 6/2005 | Doris et al. |
| 2004/0031979 | A1 | 2/2004 | Lochtefeld et al. |
| 2004/0222477 | A1 | 11/2004 | Aller et al. |
| 2004/0259324 | A1 | 12/2004 | Brask et al. |
| 2004/0266076 | A1 | 12/2004 | Doris et al. |
| 2005/0023633 | A1 | 2/2005 | Yeo et al. |
| 2005/0116289 | A1 | 6/2005 | Boyd et al. |
| 2005/0118826 | A1 | 6/2005 | Boyd et al. |
| 2005/0181612 | A1 | 8/2005 | Brask et al. |
| 2005/0275018 | A1 | 12/2005 | Venkatesan et al. |

(Continued)

FOREIGN PATENT DOCUMENTS

EP   1 519 421 A1   3/2005

(Continued)

OTHER PUBLICATIONS

Yang et al., "On the Integration of CMOS with Hybrid Crystal Orientations," IBM Semiconductor Research and Development Center, 2004 Symposium on VLSI Technology Digest of Technical Papers, 2004 IEEE, pp. 160-161.

(Continued)

*Primary Examiner*—George Fourson
*Assistant Examiner*—John M Parker

(57) ABSTRACT

A process of forming an electronic device can include forming a patterned oxidation-resistant layer over a semiconductor layer that overlies a substrate, and patterning the semiconductor layer to form a semiconductor island. The semiconductor island includes a first surface and a second surface opposite the first surface, and the first surface lies closer to the substrate, as compared to the second surface. The process can also include forming an oxidation-resistant material along a side of the semiconductor island or selectively depositing a semiconductor material along a side of the semiconductor island. The process can further include exposing the patterned oxidation-resistant layer and the semiconductor island to an oxygen-containing ambient, wherein a first portion of the semiconductor island along the first surface is oxidized during exposing the patterned oxidation-resistant layer, the semiconductor island, and the oxidation-resistant material to an oxygen-containing ambient.

20 Claims, 7 Drawing Sheets

U.S. PATENT DOCUMENTS

2006/0160294 A1* 7/2006 Cheng et al. ................ 438/221

OTHER PUBLICATIONS

Doris et al., "A Simplfied Hybrid Orientation Technology (SHOT) for High Performance CMOS," IBM Semiconductor Research and Development Center, 2004 Symposium on VLSI Technology Digest of Technical Papers, 2004 IEEE, pp. 86-87.

U.S. Appl. No. 11/328,668, entitled: Process for Forming an Electronic Device Including a Fin-Type Structure, filed Jan. 10, 2006.
U.S. Appl. No. 11/337,355, entitled: Electronic Device Including a Static-Random-Access Memory Cell and A Process of Forming the Electronic Device, filed Jan. 23, 2006.
U.S. Appl. No. 11/375,890, entitled: Electronic Device Including a Semiconductor Fin and a Process for Forming the Electronic Device, filed Mar. 15, 2006.
Actions on the Merits by the U.S.P.T.O. as of Nov. 28, 2007, 1 page.

* cited by examiner

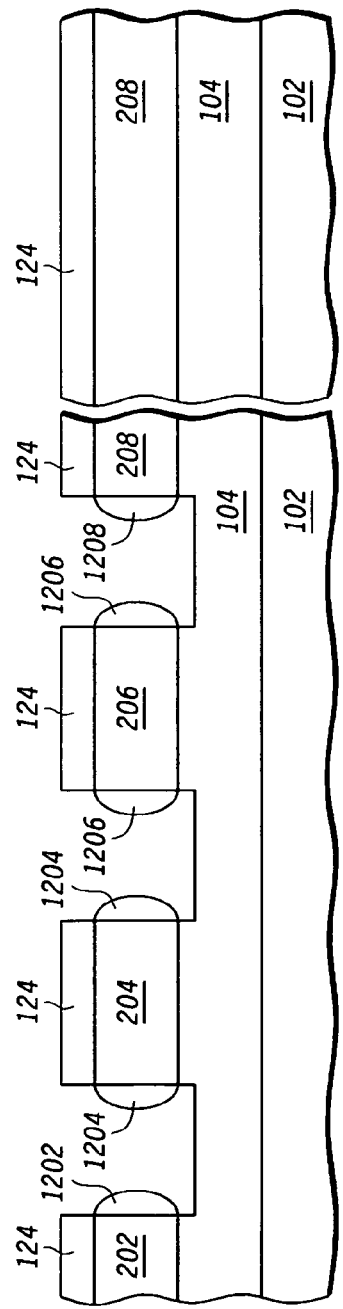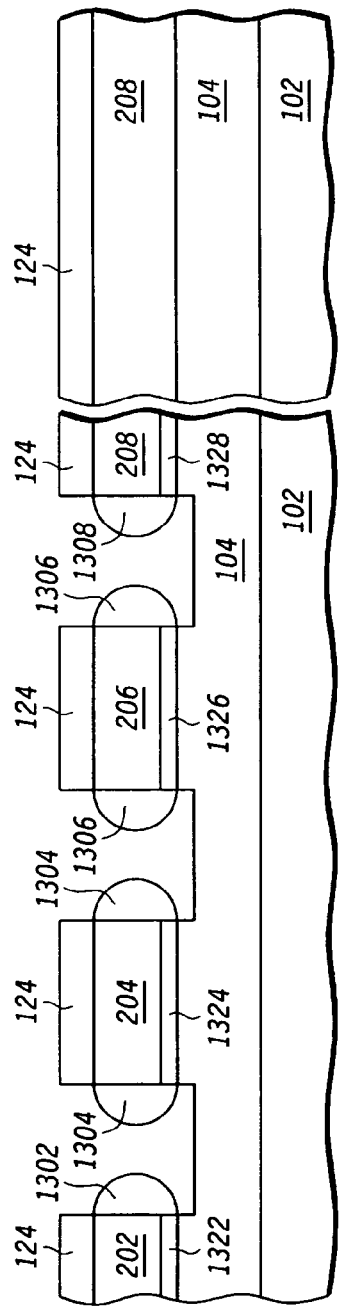

PROCESS OF FORMING AN ELECTRONIC DEVICE INCLUDING A SEMICONDUCTOR ISLAND OVER AN INSULATING LAYER

BACKGROUND

1. Field of the Disclosure

The present disclosure relates to electronic devices and processes, and more particularly to electronic devices including semiconductor regions of different thicknesses over insulating layers and processes of forming the electronic devices.

2. Description of the Related Art

Increased performance of electronic devices is resulting in more complicated structures used in the electronic devices. For integrated circuits, different semiconductor regions of different thicknesses are used in order to meet the designed performance specifications.

One attempt to achieve different thicknesses of semiconductor regions over an insulating layer can include selectively thinning portions of a semiconductor layer. Before selective thinning, the semiconductor layer may have a substantially uniform thickness. One or more masks can be used with one or more etching operations to thin some, but not all of the semiconductor layer. After selective thinning, the uppermost surfaces of the different semiconductor regions may lie at different elevations above a primary surface. The resulting topology can cause problems with lithographic operations (e.g., depth of focus) and polishing operations.

Another attempt to form different thicknesses of semiconductor regions over an insulating layer can include a Separation by Implanted Oxygen ("SIMOX") process. A semiconductor layer has a substantially uniform thickness over an underlying insulating layer. The semiconductor layer can be selectively implanted with oxygen at one or more regions where a thinner channel region of a transistor structure is desired. SIMOX processes are generally disfavored because they severely damage the one or more portions of the semiconductor layer being implanted, and annealing may not reduce the crystal defect level low enough to be used for high-performance transistors.

BRIEF DESCRIPTION OF THE DRAWINGS

The present disclosure may be better understood, and its features and advantages made apparent to those skilled in the art by referencing the accompanying drawings and the description of the drawings within this specification.

FIGS. 11 to 13 include illustrations of cross-sectional views of a portion of a substrate when using a selectively deposition process in accordance with an alternative embodiment.

Figure 1:
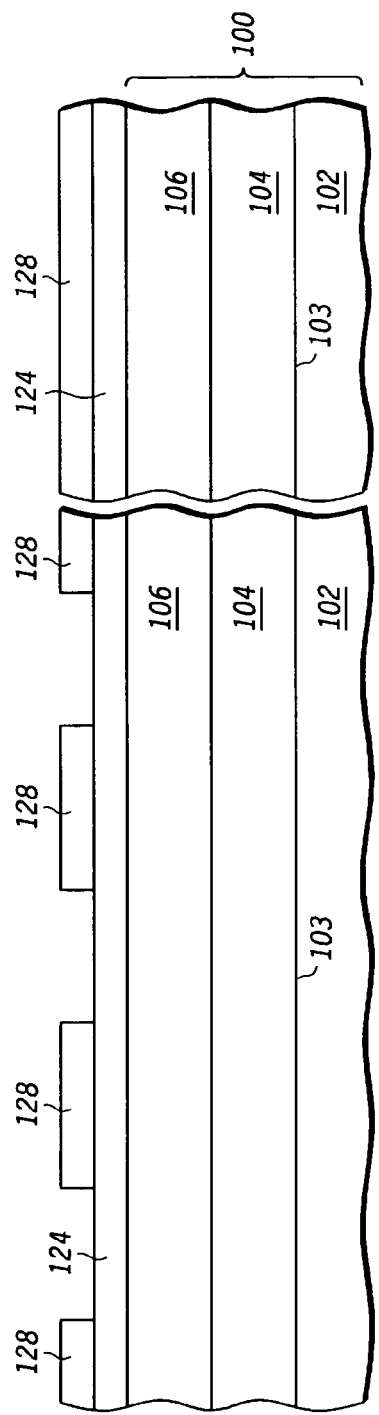
FIG. 1 includes an illustration of a cross-sectional view of a portion of a substrate after forming an oxidation-resistant layer and a masking layer over the substrate.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

A process of forming an electronic device can include forming a patterned oxidation-resistant layer over a semiconductor layer that overlies a substrate, and patterning the semiconductor layer to form a semiconductor island. The semiconductor island includes a first surface and a second surface opposite the first surface, and the first surface lies closer to the substrate, as compared to the second surface. The process can also include forming an oxidation-resistant material along a side of the semiconductor island or selectively depositing a semiconductor material along a side of the semiconductor island. The process can further include exposing the patterned oxidation-resistant layer and the semiconductor island to an oxygen-containing ambient, wherein a first portion of the semiconductor island along the first surface is oxidized during exposing the patterned oxidation-resistant layer, the semiconductor island, and the oxidation-resistant material to an oxygen-containing ambient. The embodiments can help in forming semiconductor islands of different thicknesses while keeping the top surfaces of the semiconductor islands along substantially the same plane and at substantially the same elevation above a primary surface.

Before addressing details of embodiments described below, some terms are defined or clarified. The term "elevation" is intended to mean a shortest distance to a reference plane. In one embodiment, the reference plane may be a primary surface of a substrate.

The term "high-k," with respect to dielectric constant, is intended to mean a dielectric constant of at least 8.0. The term "low-k," with respect to dielectric constant, is intended to mean a dielectric constant of lower than 8.0.

The term "lateral dimension," when referring to an object, refers to a dimension as seen from a top view of object. Lateral dimensions can include length and width. Between length and width, the width is the same or smaller than length. The diameter of a circle is considered a width, and the circle has no length for the purposes of this specification.

The term "primary surface" is intended to mean a surface of a substrate or a portion thereof from or over which one or more electronic components are subsequently formed.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this invention belongs. All publications, patent applications, patents, and other references mentioned herein are incorporated by reference in their entirety. In case of conflict, the present specification, including definitions, will control. In addition, the materials, methods, and examples are illustrative only and not intended to be limiting.

Other features and advantages of the invention will be apparent from the following detailed description, and from the claims.

To the extent not described herein, many details regarding specific materials, processing acts, and circuits are conventional and may be found in textbooks and other sources within the semiconductor and microelectronic arts.

FIG. 1 includes an illustration of a cross-sectional view of a portion of a substrate 100. The substrate 100 can include a base layer 102, an insulating layer 104, and a semiconductor layer 106. The base layer 102 can be a support layer and provide mechanical support for the other layers and has a primary surface 103. The base layer 102 can include a semiconductor material, such as silicon, germanium, carbon, or any combination thereof, an insulating material, such as quartz, glass, or a nitride, an elemental metal, a metallic alloy, or any combination thereof. The crystal orientation or structure of the base layer 102 can be the same or different from the semiconductor layer 106. The insulating layer 104 can be a low-k or high-k dielectric, such as silicon dioxide, a nitride, an oxynitride, hafnium oxide, hafnium silicate, any oxide compounds with electrical insulating properties, or any combination thereof, and have a thickness in a range of approximately 5 to approximately 1000 nm. The semiconductor layer 106 can include a semiconductor element or a compound alloy, such as silicon, germanium, carbon, SiGe, SiC, Si—Ge—C, or any combination thereof, and have a substantially uniform thickness in a range of approximately 5 to approximately 150 μnm. In a particular embodiment, the semiconductor layer 106 is substantially monocrystalline. The semiconductor layer 106 can be doped with a p-type dopant or an n-type dopant, or can be substantially undoped. The substrate 100 can be obtained from one or more commercially available sources or the substrate 100 can be formed using conventional or proprietary deposition or growth techniques.

An oxidation-resistant layer 124 and a patterned masking layer 128 are formed over portions of the substrate 100, as illustrated in FIG. 1. The oxidation-resistant layer 124 can include a material that helps to reduce oxygen diffusion or other migration through the oxidation-resistant layer 124 to the semiconductor layer 106 during a subsequent oxidation. The oxidation-resistant layer 124 can include silicon nitride, aluminum nitride, a metallic nitride, or any combination thereof. In another embodiment, the oxidation-resistant layer 124 may include an oxide, such as silicon oxynitride, aluminum oxynitride, a metallic oxynitride, or any combination thereof. In still another embodiment, the oxidation-resistant layer may include a metallic element that substantially prevents oxidation from migrating through it to the underlying semiconductor layer 106. For example, the oxidation-resistant layer 124 can include $Al_2O_3$, $LaAlO_3$, or another metallic insulating compound that are substantially thermally stable at temperatures conventionally used when processing SOI substrates, or any combination thereof.

In this particular embodiment, a relatively thin oxide or nitride layer (not illustrated) may be formed over the semiconductor layer 106 and before forming the oxidation-resistant layer 124 to reduce the likelihood all of diffusion, reaction, or an undesired interaction between the metallic element and the semiconductor layer 16.

The thickness of the oxidation-resistant layer 124 may depend on the material used for the oxidation-resistant layer 124 and the subsequent oxidation processing condition. The oxidation-resistant layer 124 can have a thickness in a range of approximately 10 to approximately 10,000 nm. In a particular embodiment, the oxidation-resistant layer 124 can include a nitride or an oxynitride and has a thickness in a range of approximately 30 to approximately 500 nm. The oxidation-resistant layer 124 can be formed using a conventional or proprietary deposition or growth technique.

The masking layer 128 is formed over the oxidation-resistant layer 124 and patterned using a conventional or proprietary lithographic technique. The masking layer 128 may include a radiation-imageable organic resist material. Portions of the masking layer 128 that remain will generally correspond to areas where semiconductor islands will be formed from the semiconductor layer 106.

Figure 2:
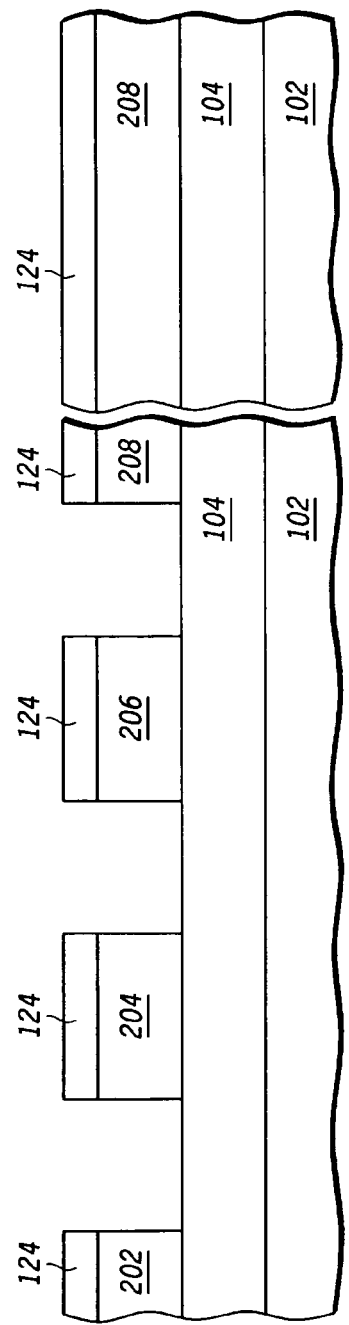
FIG. 2 includes an illustration of a cross-sectional view of the substrate of FIG. 1 after patterning the oxidation-resistant layer over the substrate.

In FIG. 2, exposed to portions of the oxidation-resistant layer 124 and the semiconductor layer 106 are removed to form a patterned oxidation-resistant layer 124 and semiconductor islands 202, 204, 206, and 208. The removal may be performed using one or more conventional or proprietary etching techniques. The insulating layer 104 can act as an etch-stop layer in one embodiment. The masking layer 128 (not illustrated in FIG. 2) can be removed using a conventional or proprietary technique.

Figure 3:
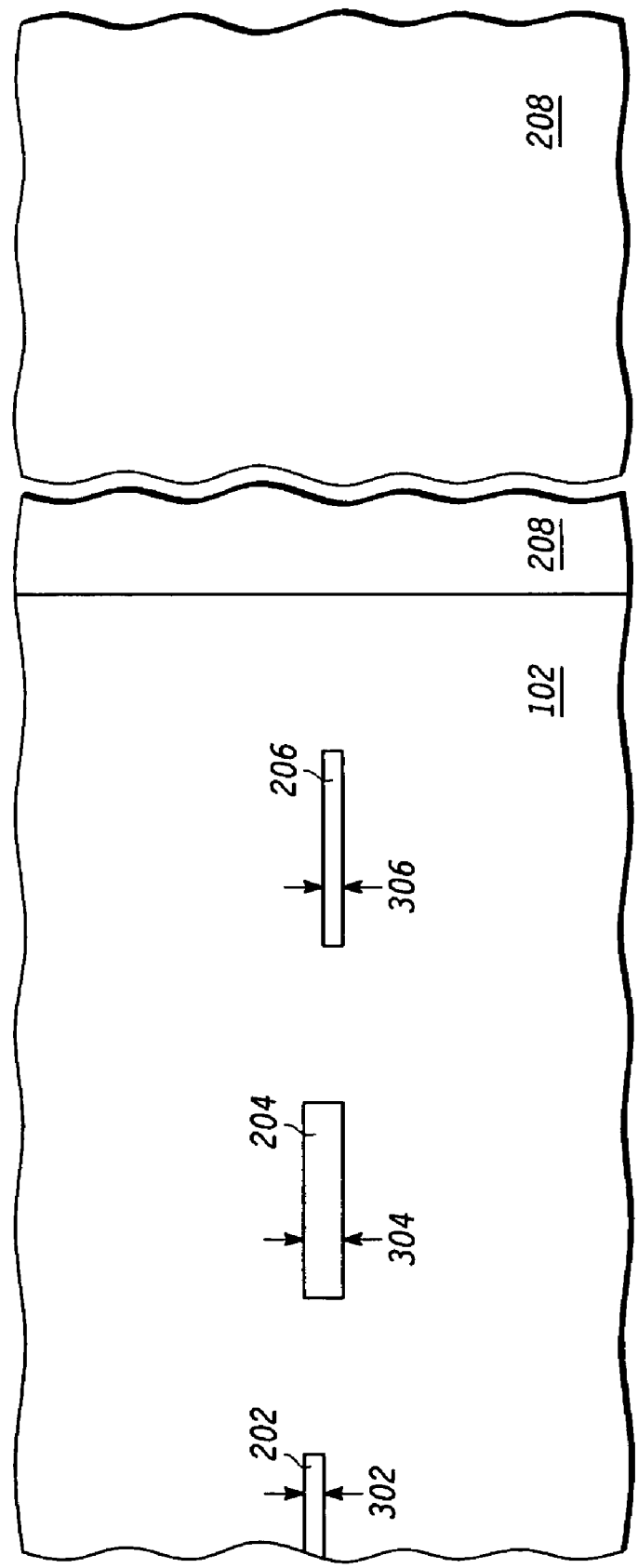
FIG. 3 includes an illustration of a top view of the substrate of FIG. 2 after patterning a semiconductor layer to form semiconductor islands.

FIG. 3 includes an illustration of a top view of the workpiece at this point in the process. The oxidation-resistant layer 124 and the insulating layer 104 are not illustrated in FIG. 3 to improve understanding of dimensions and the positional relationships between the base layer 102 and the semiconductor islands 202, 204, 206, and 208. The semiconductor islands 202, 204, 206, and 208 may have the same or different shapes, the same or different sizes, or any combination thereof.

The semiconductor islands 202, 204, and 206 have corresponding widths 302, 304, and 306, respectively. The widths 302, 304, and 306 may be narrow enough to allow an oxidizing species to diffuse or otherwise migrate underneath substantially all of the semiconductor islands 202, 204, 206, or any combination thereof. Each of the widths 302, 304, and 306 may be no greater then approximately 1 microns, and in a particular embodiment may be less then approximately 0.5 micron, and in a more particular embodiment may be less than approximately 0.2 microns. The semiconductor island 208 is significantly larger than the semiconductor islands 202, 204, and 206, and a width of the semiconductor island 208 may be greater than approximately 1.1 microns. Thus, only a portion (not all) of the semiconductor island 208 may be oxidized during a subsequent oxidation.

Figure 4:
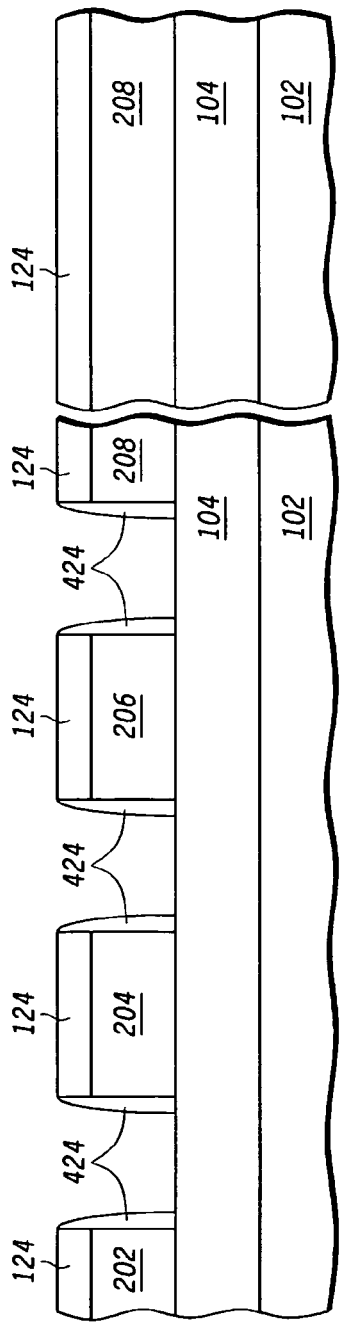
FIG. 4 includes an illustration of a cross-sectional view of the substrate of FIG. 3 after forming oxidation-resistant spacers adjacent to the semiconductor islands.

An oxidation-resistant material can be formed over the substrate and along the sides of the semiconductor islands 202, 204, 206, and 208 and etched to form oxidation-resistant spacers 424 adjacent to sides of the semiconductor islands 202, 204, 206, and 208, as illustrated in FIG. 4. The oxidation-resistant spacers 424 may include any one or more of the materials as previously described with respect to the oxidation-resistant layer 124. The oxidation-resistant layer 124 and the oxidation-resistant spacers 424 may have the same composition or different compositions. The oxidation-resistant spacers 424 may have a thickness as described with respect to the oxidation-resistant layer 124, but no greater than the thickness of the semiconductor island 202, 204, 206, 208, or any combination thereof. The oxidation-resistant layer 124 and the oxidation-resistant spacers 424 may have the same thickness or different thicknesses. The oxidation-resistant spacers 424 may be formed using a conventional or proprietary deposition and etch process.

Figure 5:
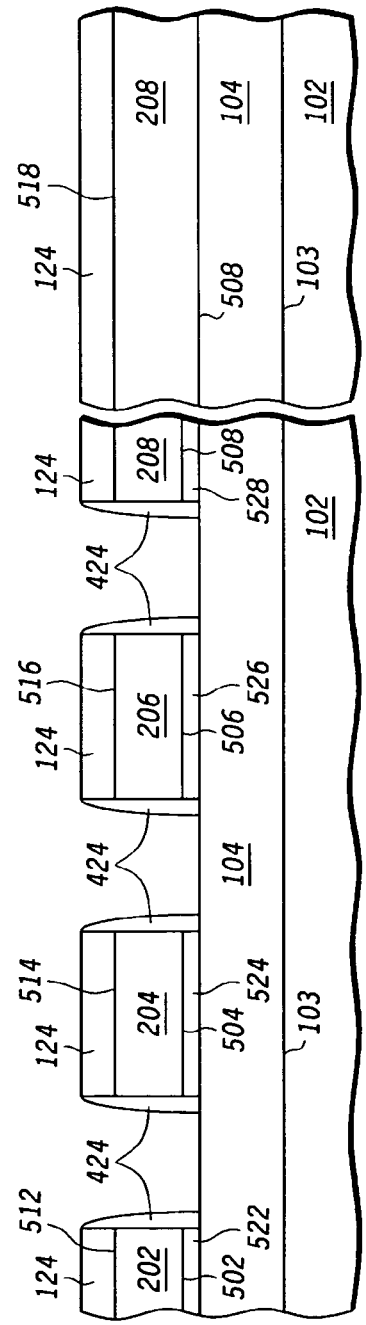
FIG. 5 includes an illustration of a cross-sectional view of the substrate of FIG. 4 after thermally oxidizing portions of the semiconductor islands.

The workpiece, including the patterned oxidation-resistant layer 124, the semiconductor islands 202, 204, 206, and 208, and the oxidation-resistant spacers 424, is exposed to an oxygen-containing ambient that oxidizes portions of the semiconductor islands 202, 204, 206, and 208 to form oxide portions 522, 524, 526, and 528, respectively, as illustrated in FIG. 5. Each of the oxide portions 522, 524, 526, and 528 can have a thickness of at least approximately 1 nm. In a particular embodiment, each of the oxide portions 522, 524, 526, and 528 may have a thickness in a range of approximately 10 to approximately 500 nm. In another embodiment, each of the oxide portions 522, 524, and 526 can have a thickness that is least approximately 1% of the remaining thickness of its overlying semiconductor island 202, 204, or 206. In a particular embodiment, each of the oxide portions 522, 524, and 526 may have a thickness in a range of approximately 20% to approximately 300% of the remaining thickness of its overlying semiconductor island 202, 204, or 206.

The oxygen-containing ambient can include oxygen, steam, ozone, one or more other suitable oxidizing species, or any combination thereof. In one embodiment, the oxidation can be performed at a temperature of at least approximately 800° C. In a particular embodiment, the oxidation may be performed in a range of approximately 900° C. to approximately 1200° C.

During the oxidation, an oxidizing species from the oxygen-containing ambient may diffuse or otherwise migrate through a portion of the insulating layer 104 and oxidize the bottom surfaces 502, 504, 506, and 508 of the semiconductor islands 202, 204, 206, and 208, respectively. The presence of the oxidation-resistant layer 124 and the oxygen-resistant spacers 424 substantially prevent the oxidizing species from the oxygen-containing ambient from reaching top surfaces 512, 514, 516, and 518 of the semiconductor islands 202, 204, 206, and 208, respectively. Thus, the semiconductor islands 202, 204, 206, and 208 can be thinned without significantly affecting their top surfaces 512, 514, 516, and 518, and therefore, the top surfaces 512, 514, 516, and 518 may remain at substantially the same elevation above the primary surface 103 of the base layer 102.

The relatively smaller widths 304 and 306 of the semiconductor islands 204 and 206, respectively, as compared to the semiconductor island 208 allow the oxide portions 524 and 526 to form along substantially all of the bottom surfaces 504 and 506 of the semiconductor islands 204 and 206. The relatively larger lateral dimensions of the semiconductor island 208 allow the oxide portion 528 to form along only a portion of and not along all of the bottom surface 508 of the semiconductor island 208.

Figure 6:
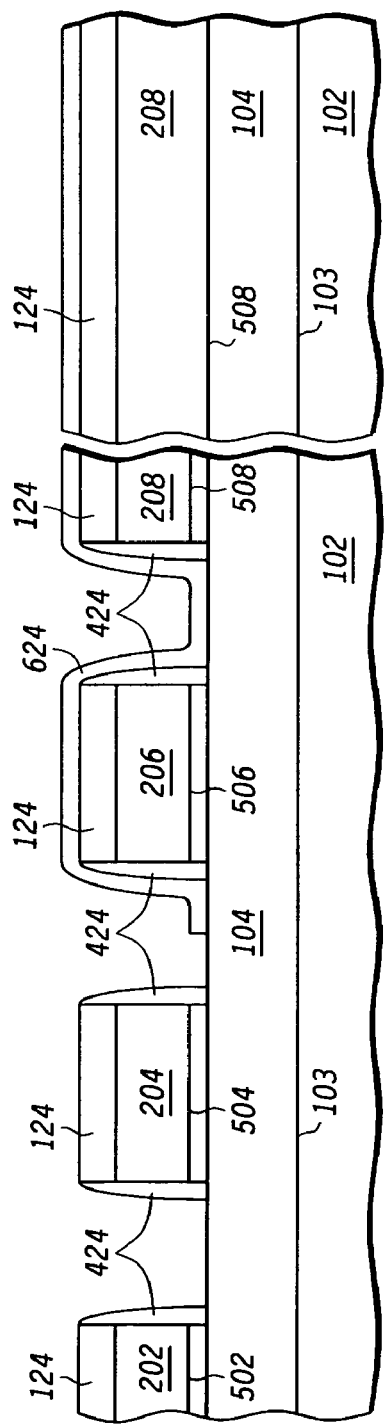
FIG. 6 includes an illustration of a cross-sectional view of the substrate of FIG. 5 after forming an oxidation-resistant layer over a portion of the substrate.

An oxidation-resistant layer 624 can be formed over the substrate and patterned, as illustrated in FIG. 6. The remaining portion of the oxidation-resistant layer 624 in FIG. 6 helps to protect the semiconductor islands 206 and 208 from being significantly further oxidized during a subsequent oxidation. The oxidation-resistant layer 624 may include any one or more of the materials as previously described with respect to the oxidation-resistant layer 124. The oxidation-resistant layers 124 and 624 may have the same composition or different compositions. The oxidation-resistant layer 624 may have a thickness as described with respect to the oxidation-resistant layer 124. The oxidation-resistant layer 124 and the oxidation-resistant layer 624 may have the same thickness or different thicknesses. The oxidation-resistant layer 624 may be formed using a conventional or proprietary deposition and etch process.

Figure 7:
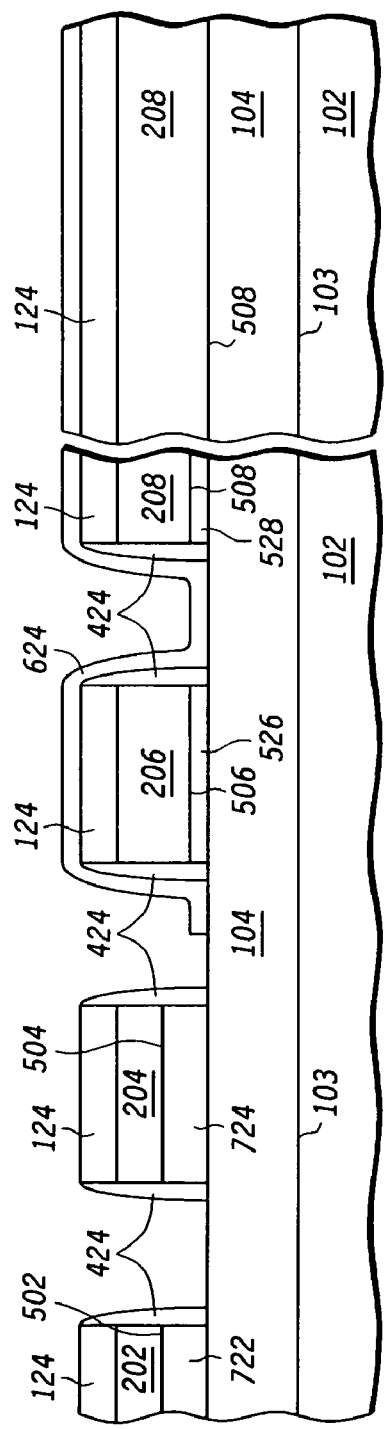
FIG. 7 includes an illustration of a cross-sectional view of the substrate of FIG. 6 after thermally oxidizing portions of the semiconductor islands not covered by the oxidation-resistant layer.

The workpiece is exposed to an oxygen-containing ambient that oxidizes portions of the semiconductor islands 202 and 204 to form oxide portions 722 and 724, respectively, as illustrated in FIG. 7. The presence of the oxidation-resistant layer 624 helps to substantially prevent the semiconductor islands 206 and 208 from being further oxidized. The oxide portions 722 and 724 are thicker than the oxide portions 526 and 528, and the oxide portions 522 and 524, as originally formed (in FIG. 5). Each of the oxide portions 722 and 724 can have a thickness of at least approximately 2 nm. In a particular embodiment, each of the oxide portions 722 and 724 may have a thickness in a range of approximately 10 to approximately 500 nm. In another embodiment, each of the oxide portions 722 and 724 can have a thickness that is least approximately 1% of the remaining thickness of its overlying semiconductor island 202 or 204. In a particular embodiment, each of the oxide portions 722 and 724 may have a thickness in a range of approximately 20% to approximately 300% of the remaining thickness of its overlying semiconductor island 202 or 204. The oxygen-containing ambient can include oxygen, steam, ozone, one or more other suitable oxidizing species, or any combination thereof. In one embodiment, the oxidation can be performed at a temperature of at least approximately 800° C. In a particular embodiment, the oxidation may be performed in a range of approximately 900° C. to approximately 1200° C.

Figure 8:
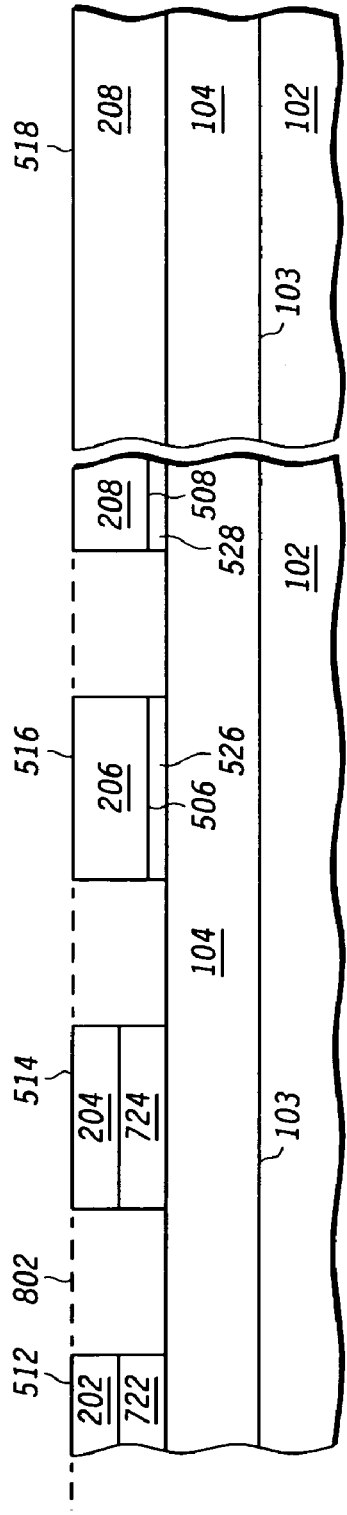
FIG. 8 includes an illustration of a cross-sectional view of the substrate of FIG. 7 after removing the oxidation-resistant spacers and oxidation-resistant layer.

The oxidation-resistant layers 124 and 624, and oxidation-resistant spacers 424 are removed using a conventional etching technique to expose the semiconductor islands 202, 204, 206, and 208, as illustrated in FIG. 8. The top surfaces 512, 514, 516, and 518 of the semiconductor islands 202, 204, 206, and 208, respectively, lie substantially along the same plane (illustrated as dashed line 802 in FIG. 8) and are substantially parallel to the primary surface 103 of the base layer 102. Thus, different thicknesses of semiconductor islands can be formed and substantially prevent problems that may be occur with subsequently lithography and polishing operations if the top surfaces of the semiconductor islands would lie at significantly different elevations In the embodiment as illustrated in FIG. 8, each of the semiconductor islands 202 and 204 are thinner than each of the semiconductor islands 206 and 208, and the semiconductor island 206 is thinner than the semiconductor island 208 at a location spaced apart from the sidewall of the semiconductor island 208 (near the right-hand portion of FIG. 8). The performance of electronic components (e.g., transistors) can be tailored by adjusting height of its corresponding semiconductor island accordingly. Thus, partially depleted and fully depleted transistors can be formed in different semiconductor islands on the same integrated circuit. The height may also affect saturation current of a transistor, capacitance of a capacitor or a transistor (across the gate dielectric), resistance of a resistor or a transistor (through the channel region), one or more other suitable electrical parameters, or any combination thereof.

Figure 9:
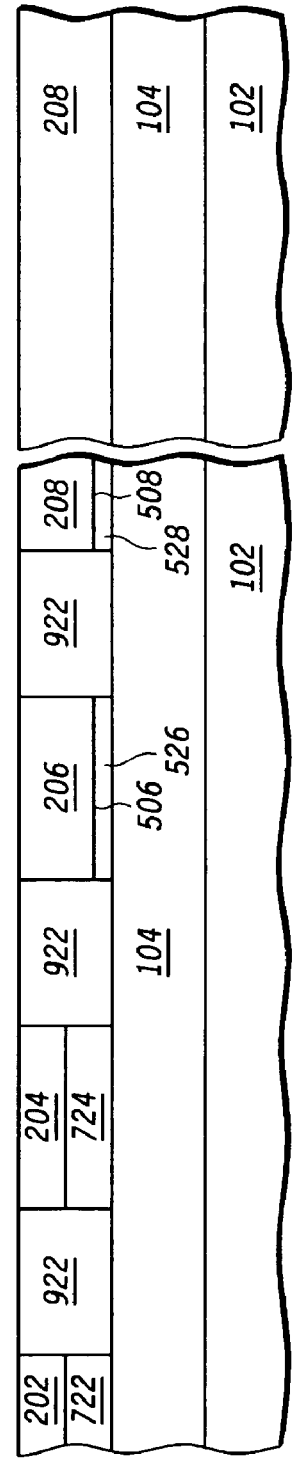
FIG. 9 includes an illustration of a cross-sectional view of the substrate of FIG. 8 after forming field isolation regions between the semiconductor islands.

Field isolation regions 922 can be formed between the semiconductor islands 202, 204, 206, and 208, as illustrated in FIG. 9. In one embodiment, the field isolation regions 922 are formed by a conventional or proprietary deposition and polishing operation. Polishing non-uniformity may be less because the semiconductor islands 202, 204, 206, and 208 lie at substantially the same plane. Although not illustrated, one or more doping actions may be performed to change a conductivity type of one or more of the semiconductor islands, change a dopant concentration of one or more of the semiconductor islands, or any combination thereof.

Processing is continued to form transistor structures 1024, 1026, and 1028 of the electronic device 1000. The transistor structure 1024, 1026, 1028, or any combination thereof can be configured as a transistor, a capacitor, a resistor, or the like. The transistor structure 1024, 1026, 1028, or any combination thereof can be a p-channel transistor, an n-channel transistor, an enhancement mode transistor, a depletion mode transistor, a fully depleted transistor, a partially depleted transistor, or any combination thereof.

Figure 10:
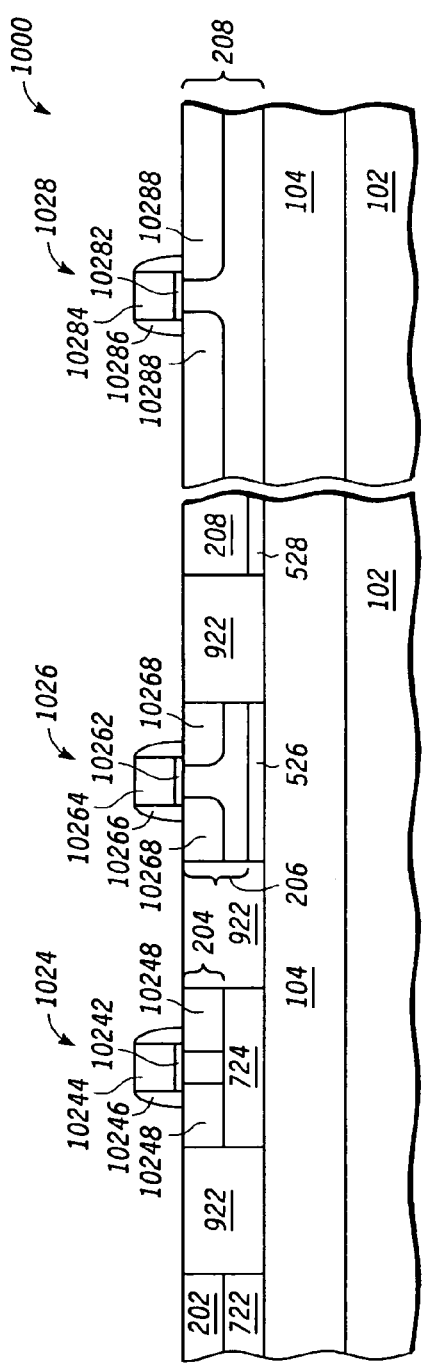
FIG. 10 includes an illustration of a cross-sectional view of the substrate of FIG. 9 after forming transistor structures using the semiconductor islands.

The transistor structures 1024, 1026, and 1028 can be formed using conventional or proprietary techniques, including growing, deposition, etch, doping, or any combination thereof using conventional or proprietary materials. The transistor structure 1024 can include a gate dielectric layer 10242, a gate electrode 10244, and source/drain ("S/D") regions 10248, the transistor structure 1026 can include a gate dielectric layer 10262, a gate electrode 10264, and S/D regions 10268, and the transistor structure 1028 can include a gate dielectric layer 10282, a gate electrode 10284, and S/D regions 10288. Sidewall spacers 10246, 10266, and 10286 may be formed after forming the adjacent gate electrodes 10244, 10264, and 10284, respectively, and before forming the adjacent S/D 10248, 10268, and 10288, respectively. In the embodiment as illustrated in FIG. 10, the S/D regions 10248 abut the oxide portion 724, whereas the S/D regions 10268 and 10288 are spaced apart from the underlying oxide portions 726 and 728, respectively.

Although not illustrated, additional processing may be performed to form a substantially completed electronic device. An insulating layer, an interconnect level, a passivation layer, a die coat layer, or any combination thereof may be formed using a conventional or proprietary deposition, etch, polishing, or any combination thereof operation.

In another embodiment (not illustrated), the transistor structure 1024, 1026, 1028, or any combination thereof may be formed as a fin-type transistor structure. After forming the field isolation regions 922 in FIG. 9, the semiconductor island 204, 206, 208, or any combination thereof could be etched using a conventional or proprietary technique to form a fin before forming the gate dielectric layer, the gate electrode, and S/D regions for the transistor structure. Thus, all planar transistor structures, all fin-type transistor structures, or a combination of planar and fin-type transistors can be formed.

Figure 11:
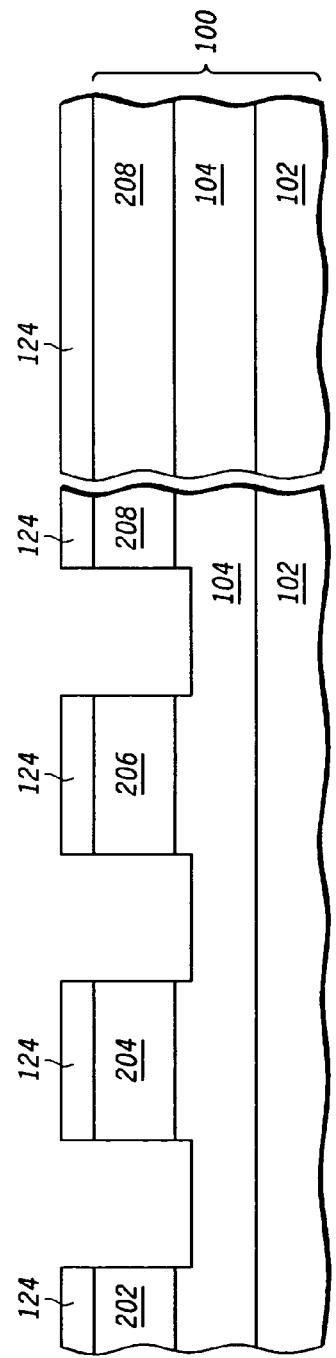

In still another embodiment, the oxidation-resistant spacers 424 can be replaced by a layer that is selectively grown from the semiconductor layer 106 as illustrated in FIG. 11. When patterning the semiconductor layer 106, the same etch or a different etch can be performed to etch some of the exposed insulating layer 104 to better expose the semiconductor islands 202, 204, 206, and 208 to a subsequent oxidation. The etch of the insulating layer 104 can be performed using a conventional or proprietary technique.

Semiconductor portions 1202, 1204, 1206, and 1208 can be selectively grown or otherwise selectively deposited from the semiconductor islands 202, 204, 206, and 208, respectively, using a conventional or proprietary technique. In one embodiment, the thickness of the semiconductor portions 1202, 1204, 1206, and 1208 can be in a range of approximately 30% to approximately 60% of the thickness of the subsequently formed oxide portions along bottom surfaces of the semiconductor islands 202, 204, 206, and 208. In another embodiment, the thickness of the semiconductor portions 1202, 1204, 1206, and 1208 can be in a range of approximately 5 to approximately 300 nm. The semiconductor portions 1202, 1204, 1206, and 1208 can include one or more of the materials as described with respect to the semiconductor layer 106. The 1202, 1204, 1206, and 1208 may have the same composition or a different composition as compared to the semiconductor layer 106.

The workpiece is exposed to an oxygen-containing ambient that oxidizes portions of the semiconductor islands 202, 204, 206, and 208 to form oxide portions 1322, 1324, 1326, and 1328, respectively, as illustrated in FIG. 13. The oxide portions 1322, 1324, 1326, and 1328 can be formed and have a thickness as described with respect to the oxide portions 522, 524, 526, and 528 in FIG. 5. During the oxidation, the semiconductor portions 1202, 1204, 1206, and 1208 can also be oxidized to form oxide portions 1302, 1304, 1306, and 1308, respectively. In one embodiment, substantially all of the semiconductor portions 1202, 1204, 1206, and 1208 are oxidized (FIG. 13), and in another embodiment, only part (not all) of the semiconductor portions 1202, 1204, 1206, and 1208 are oxidized. Processing can continue with the formation of the field isolation regions (FIG. 9). Part, all, or none of the oxide portions 1302, 1304, 1306, and 1308 may be removed before forming the field isolation regions 922. In a particular embodiment, a semiconductor element can migrate from a semiconductor portion 1202, 1204, 1206, 1208, or any combination thereof into the corresponding semiconductor island 202, 204, 206, 208, or any combination thereof. In one particular embodiment, the semiconductor islands 202, 204, 206, and 208 are silicon islands, and the semiconductor portions 1202, 1204, 1206, and 1208 are silicon germanium portions. During the oxidation, germanium from the semiconductor portions 1202, 1204, 1206, and 1208 can diffuse or otherwise migrate into the semiconductor islands 202, 204, 206, and 208 to increase the germanium concentration within the semiconductor islands 202, 204, 206, and 208.

In a further embodiment (not illustrated), a combination of oxidation-resistant spacers and semiconductor portions may be used. In a particular embodiment, the oxidation-resistant spacers may be formed adjacent to semiconductor islands that will be used in forming n-channel transistors, and silicon-germanium portions may be formed adjacent to the semiconductor islands that will be used in forming p-channel transistors.

One or more of the embodiments described herein can allow different electronic components to be designed with different thicknesses of semiconductor islands with a reduced likelihood of complications due to lithographic, polishing, or other processing consideration. A designer of the electronic device can have greater flexibility in designing electronic components, particularly when semiconductor-on-insulator substrates are used.

Many different aspects and embodiments are possible. Some of those aspects and embodiments are described below.

After reading this specification, skilled artisans will appreciate that those aspects and embodiments are only illustrative and do not limit the scope of the present invention.

In a first aspect, a process of forming an electronic device can include forming a patterned oxidation-resistant layer over a semiconductor layer that overlies a substrate and patterning the semiconductor layer to form a first semiconductor island. The first semiconductor island can include a first surface and a second surface opposite the first surface, and the first surface may lie closer to the substrate, as compared to the second surface. The process can also include forming an oxidation-resistant material along a side of the first semiconductor island and exposing the patterned oxidation-resistant layer, the first semiconductor island, and the oxidation-resistant material to an oxygen-containing ambient. A first portion of the first semiconductor island along the first surface can be oxidized during exposing the patterned oxidation-resistant layer, the first semiconductor island, and the oxidation-resistant material to an oxygen-containing ambient.

In one embodiment of the first aspect, the process can further include removing the patterned oxidation-resistant layer after exposing the patterned oxidation-resistant layer, the first semiconductor island, and the oxidation-resistant material to an oxygen-containing ambient. In a particular embodiment, the process can further include removing the oxidation-resistant material after exposing the patterned oxidation-resistant layer, the first semiconductor island, and the oxidation-resistant material to an oxygen-containing ambient.

In another embodiment, the patterned oxidation-resistant layer and the oxidation-resistant material include a nitride. In yet another embodiment of the first aspect, exposing the patterned oxidation-resistant layer, the first semiconductor island, and the oxidation-resistant material to an oxygen-containing ambient can be performed at a temperature of at least approximately 800° C.

In a further embodiment, exposing the patterned oxidation-resistant layer, the first semiconductor island, and the oxidation-resistant material to an oxygen-containing ambient can be performed, such that the first portion of the first semiconductor island lies along substantially all of the first surface. In a particular embodiment, patterning the semiconductor layer is performed such that the first semiconductor island has a lateral dimension no greater than approximately one micron. In a more particular embodiment, patterning the semiconductor layer also forms a second semiconductor island, wherein the second semiconductor island includes a third surface and a fourth surface opposite the third surface, and the third surface lies closer to the substrate, as compared to the fourth surface. Exposing the patterned oxidation-resistant layer, the first semiconductor island, and the oxidation-resistant material to an oxygen-containing ambient can be performed, such that a second portion of the second semiconductor island lying along of the third surface is oxidized, and the second portion of the second semiconductor island lies along part, but not all, of the third surface.

In an even more particular embodiment of the first aspect, patterning the semiconductor layer is performed such that the second semiconductor island does not have a lateral dimension of less than approximately one micron. In another even more particular embodiment, after exposing the patterned oxidation-resistant layer, the first semiconductor island, and the oxidation-resistant material to an oxygen-containing ambient, the second surface of the first semiconductor island and the fourth surface of the second semiconductor island lie at substantially a same elevation.

In a second aspect, a process of forming an electronic device can include forming a patterned oxidation-resistant layer over a semiconductor layer that overlies a substrate and patterning the semiconductor layer to form a first semiconductor island. The first semiconductor island can include a first surface and a second surface opposite the first surface, and the first surface may lie closer to the substrate, as compared to the second surface. The process can also include selectively depositing a semiconductor material along a side of the first semiconductor island and exposing the patterned oxidation-resistant layer, the first semiconductor island, and the semiconductor material to an oxygen-containing ambient. A first portion of the first semiconductor island along the first surface can be oxidized during exposing the patterned oxidation-resistant layer, the first semiconductor island, and the oxidation-resistant material to an oxygen-containing ambient.

In one embodiment of the second aspect, selectively depositing can include epitaxially growing a silicon layer at the side of the first semiconductor island. In another embodiment, selectively depositing can include epitaxially growing a silicon-germanium layer at the side of the first semiconductor island. In a particular embodiment, during exposing the patterned oxidation-resistant layer, the first semiconductor island, and the semiconductor material to an oxygen-containing ambient, germanium from the silicon-germanium layer can migrate into the first semiconductor island. In still another embodiment, exposing the patterned oxidation-resistant layer, the first semiconductor island, and the semiconductor material to an oxygen-containing ambient is performed at a temperature of at least approximately 800° C.

In a further embodiment of the second aspect, exposing the patterned oxidation-resistant layer, the first semiconductor island, and the semiconductor material to an oxygen-containing ambient can be performed, such that the first portion of the first semiconductor island lies along substantially all of the first surface. In a particular embodiment, patterning the semiconductor layer can be performed such that the first semiconductor island has a lateral dimension no greater than approximately one micron. In a more particular embodiment, the second surface of the first semiconductor island may not be significantly oxidized during exposing the patterned oxidation-resistant layer, the first semiconductor island, and the semiconductor material to an oxygen-containing ambient.

In another more particular embodiment of the second aspect, patterning the semiconductor layer can also form a second semiconductor island, wherein the second semiconductor island includes a third surface and a fourth surface opposite the third surface, and the third surface lies closer to the substrate, as compared to the fourth surface. Exposing the patterned oxidation-resistant layer, the first semiconductor island, and the semiconductor material to an oxygen-containing ambient can be performed, such that a second portion of the second semiconductor island lying along the third surface is oxidized, and the second portion of the second semiconductor island lies along part, but not all, of the third surface. In an even more particular embodiment, patterning the semiconductor layer is performed such that the second semiconductor island does not have a lateral dimension of less than approximately one micron.

Note that not all of the activities described above in the general description or the examples are required, that a portion of a specific activity may not be required, and that one or more further activities may be performed in addition to those described. Still further, the order in which activities are listed is not necessarily the order in which they are performed.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that a structural substitution, logical substitution, or another change may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. §1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed subject matter requires more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A process of forming an electronic device comprising:
    forming a first patterned oxidation-resistant layer over a semiconductor layer,
        wherein the semiconductor layer overlies an insulating layer that overlies a base layer;
    patterning the semiconductor layer to form a first semiconductor island, wherein:
        the first semiconductor island includes a first surface and a second surface opposite the first surface;
        substantially all of the first semiconductor island and abuts and overlies the insulating layer;
        the first surface lies closer to the base layer, as compared to the second surface; and
        the second surface is spaced apart from the insulating layer;
    forming an oxidation-resistant material along a side of the first semiconductor island; and
    exposing the first patterned oxidation-resistant layer, the first semiconductor island, and the oxidation-resistant material to a first oxygen-containing ambient, wherein a first portion of the first semiconductor island along the first surface is oxidized during exposing the first patterned oxidation-resistant layer, the first semiconductor island, and the oxidation-resistant material to the first oxygen-containing ambient.

2. The process of claim 1, further comprising removing the first patterned oxidation-resistant layer after exposing the first patterned oxidation-resistant layer, the first semiconductor island, and the oxidation-resistant material to the first oxygen-containing ambient.

3. The process of claim 2, further comprising removing the oxidation-resistant material after exposing the first patterned oxidation-resistant layer, the first semiconductor island, and the oxidation-resistant material to the first oxygen-containing ambient.

4. The process of claim 1, wherein the first patterned oxidation-resistant layer and the oxidation-resistant material comprise a nitride.

5. The process of claim 1, wherein exposing the first patterned oxidation-resistant layer, the first semiconductor island, and the oxidation-resistant material to the first oxygen-containing ambient is performed at a temperature of at least approximately 800° C.

6. The process of claim 1, wherein exposing the first patterned oxidation-resistant layer, the first semiconductor island, and the oxidation-resistant material to the first oxygen-containing ambient is performed, such that the first portion of the first semiconductor island lies along substantially all of the first surface.

7. The process of claim 1, wherein exposing the first patterned oxidation-resistant layer, the first semiconductor island, and the oxdation-resistant material to the first oxygen-containing ambient is performed, such that a thickness of the first semiconductor island, as measured in a direction substantially perpendicular to a primary surface of the base layer, is reduced.

8. The process of claim 7, wherein:
    patterning the semiconductor layer also forms a second semiconductor island, wherein:
        the second semiconductor island includes a third surface and a fourth surface opposite the third surface; and
        the third surface lies closer to the base layer, as compared to the fourth surface; and exposing the first patterned oxidation-resistant layer, the first semiconductor island, and the oxidation-resistant material to first oxygen-containing ambient is performed, such that:
- a second portion of the second semiconductor island lying along the third surface is oxidized; and
- the second portion of the second semiconductor island lies along part, but not all, of the third surface.

9. The process of claim 1, wherein:
patterning the semiconductor layer also forms a second semiconductor island including a third surface and a fourth surface opposite the third surface, wherein:
- substantially all the second semi conductor island abuts and overlies the insulating item:
- the third surface lies closer to the base layer, as compared to the fourth surface; and
- the fourth surface is spaced apart from the insulating layer;

the process further comprises:
- forming a second patterned oxidation-resistant layer that overlies the second semiconductor island, but does not overlie the first semiconductor island; and
- exposing the second patterned oxidation-resistant layer, the first semiconductor island, and parts of the first patterned oxidation-resistant layer and the oxidation-resistant material to a second oxygen-containing ambient, wherein another portion of the first semiconductor island adjacent to the insulating layer is oxidized but the second semiconductor island is not significantly oxidized.

10. The process of claim 8, wherein after exposing the first patterned oxidation-resistant layer, the first semiconductor island, and the oxidation-resistant material to the first oxygen-containing ambient, the second surface of the first semiconductor island and the fourth surface of the second semiconductor island lie at substantially a same elevation.

11. A process of forming an electronic device comprising:
forming a patterned oxidation-resistant layer over a semiconductor layer that overlies a substrate;
patterning the semiconductor layer to form a first semiconductor island, wherein:
- the first semiconductor island includes a first surface and a second surface opposite the first surface; and
- the first surface lies closer to the substrate, as compared to the second surface;

selectively depositing a semiconductor material along a side of the first semiconductor island; and
exposing the patterned oxidation-resistant layer, the first semiconductor island, and the semiconductor material to an oxygen-containing ambient, wherein a first portion of the first semiconductor island along the first surface is oxidized during exposing the patterned oxidation-resistant layer, the first semiconductor island, and the oxidation-resistant material to an oxygen-containing ambient.

12. The process of claim 11, wherein selectively depositing comprises epitaxially growing a silicon layer at the side of the first semiconductor island.

13. The process of claim 11, wherein selectively depositing comprises epitaxially growing a silicon-germanium layer at the side of the first semiconductor island.

14. The process of claim 13, wherein during exposing the patterned oxidation-resistant layer, the first semiconductor island, and the semiconductor material to an oxygen-containing ambient, germanium from the silicon-germanium layer migrates into the first semiconductor island.

15. The process of claim 11, wherein exposing the patterned oxidation-resistant layer, the first semiconductor island, and the semiconductor material to an oxygen-containing ambient is performed at a temperature of at least approximately 800° C.

16. The process of claim 11, wherein exposing the patterned oxidation-resistant layer, the first semiconductor island, and the semiconductor material to an oxygen-containing ambient is performed, such that the first portion of the first semiconductor island lies along substantially all of the first surface.

17. The process of claim 16, wherein patterning the semiconductor layer is performed such that the first semiconductor island has a lateral dimension no greater than approximately one micron.

18. The process of claim 17, wherein the second surface of the first semiconductor island is not significantly oxidized during exposing the patterned oxidation-resistant layer, the first semiconductor island, and the semiconductor material to an oxygen-containing ambient.

19. The process of claim 17, wherein:
patterning the semiconductor layer also forms a second semiconductor island, wherein:
- the second semiconductor island includes a third surface and a fourth surface opposite the third surface; and
- the third surface lies closer to the substrate, as compared to the fourth surface; and exposing the patterned oxidation-resistant layer; the first semiconductor island, and the semiconductor material to an oxygen-containing ambient is performed, such that:
- a second portion of the second semiconductor island lying along the third surface is oxidized; and
- the second portion of the second semiconductor island lies along part, but not all, of the third surface.

20. The process of claim 19, wherein patterning the semiconductor layer is performed such that the second semiconductor island does not have a lateral dimension of less than approximately one micron.

* * * * *